(12) United States Patent
Murdock et al.

(10) Patent No.: US 10,719,096 B2
(45) Date of Patent: Jul. 21, 2020

(54) CIRCUIT AND METHOD FOR GENERATING A REFERENCE VOLTAGE WITH A VOLTAGE REGULATOR AND A SAMPLE AND HOLD CIRCUIT

(71) Applicant: Texas Instruments Incorporated, Dallas, TX (US)

(72) Inventors: James Murdock, Richardson, TX (US); Danielle Griffith, Richardson, TX (US); Per Torstein Roine, Oslo (NO)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/248,888

(22) Filed: Aug. 26, 2016

(65) Prior Publication Data

US 2018/0059697 A1 Mar. 1, 2018

(51) Int. Cl.
G05F 1/575 (2006.01)
G11C 5/14 (2006.01)
G11C 27/02 (2006.01)

(52) U.S. Cl.
CPC .............. *G05F 1/575* (2013.01); *G11C 5/147* (2013.01); *G11C 27/02* (2013.01)

(58) Field of Classification Search
CPC .......... G05F 1/575; G11C 27/02; G11C 5/147
See application file for complete search history.

(56) References Cited

U.S. PATENT DOCUMENTS 7,595,622 B1 * 9/2009 Tomiyoshi ......... H05B 33/0818
                                                         323/284
7,616,041 B2  11/2009 Frederick, Jr. et al.
(Continued)

FOREIGN PATENT DOCUMENTS

CN   101075143   11/2007
CN   205304325    6/2016

OTHER PUBLICATIONS

R. Magod, N. Suda, V. Ivanov, R. Balasingam and B. Bakkaloglu, "A 14.8μVRM Sintegrated noise output capacitor-less low dropout regulator with a switched-RC bandgap reference," 2015 IEEE Custom Integrated Circuits Conference (CICC), San Jose, CA, 2015, pp. 1-4.*

(Continued)

*Primary Examiner* — Kyle J Moody
*Assistant Examiner* — Jye-June Lee
(74) *Attorney, Agent, or Firm* — Brian D. Graham; Charles A. Brill; Frank D. Cimino

(57) ABSTRACT

A reference generator provides a reference output voltage that is continuously available while providing certain efficiencies of a duty-cycled voltage regulator. The reference output voltage is generated by a sample-and-hold circuit that is coupled to a voltage regulator. On command, the sample-and-hold circuit samples a low dropout voltage regulator that may be referenced by a bandgap circuit. During hold periods of the sample-and-hold circuit, the voltage regulator, in particular the bandgap circuit, may be disabled in order to conserve power. A sample cycle by the sample-and-hold circuit may be triggered by a signal received from a configurable finite state machine. The reference generator is effectively duty cycled in a manner that conserves available battery power, while still providing a constant reference output that is always available. The reference generator is especially suited for low-power, battery operated applications.

20 Claims, 2 Drawing Sheets

(56) References Cited

U.S. PATENT DOCUMENTS

| | | | | |
|---|---|---|---|---|
| 7,671,574 | B1* | 3/2010 | Burinskiy | H02M 3/1588 323/271 |
| 9,774,251 | B2* | 9/2017 | Kobayashi | H02M 3/156 |
| 2005/0237042 | A1* | 10/2005 | Yoshida | H02M 3/156 323/282 |
| 2007/0052452 | A1* | 3/2007 | Chou | G11C 5/145 327/94 |
| 2011/0032027 | A1* | 2/2011 | Dash | G05F 1/56 327/539 |
| 2012/0326695 | A1* | 12/2012 | Chen | G11C 5/145 323/313 |
| 2014/0253019 | A1* | 9/2014 | Wang | H02J 7/0052 320/107 |
| 2015/0286236 | A1* | 10/2015 | Dornseifer | G05F 3/08 323/313 |
| 2017/0160763 | A1* | 6/2017 | Barbelenet | G05F 1/468 |
| 2018/0019020 | A1* | 1/2018 | Vilas Boas et al. | G05F 3/24 |

OTHER PUBLICATIONS

"An accurate, low impedance, low dropout sub-1V bandgap reference," Kin Keung (Jeff) Lau, HandHeld Power Design, Maxim Integrated, San Jose, CA, 2013.*

Tanaka, Nakagome, Etoh, Yamasaki, Aoki and Miyazawa, "Sub-1-uA dynamic reference voltage generator for battery-operated DRAMs," Symposium 1993 on VLSI Circuits, Kyoto, Japan, 1993, pp. 87-88.*

Y. Chen, M. Fojtik, D. Blaauw and D. Sylvester, "A 2.98nW bandgap voltage reference using a self-tuning low leakage sample and hold," 2012 Symposium on VLSI Circuits (Vlsic), Honolulu, HI, 2012, pp. 200-201.*

V. Nikitha, and P. Prabhavathi, "Design of Low-Dropout Regulator," IJAR 1, No. 7, p. 323-330, 2015 (Year: 2015).*

Y. Chen, M. Fojtik, D. Blaauw and D. Sylvester, "A 2.98nW bandgap voltage reference using a self-tuning low leakage sample and hold," 2012 Symposium on VLSI Circuits (VLSIC), Honolulu, HI, 2012, pp. 200-201 (Year: 2012).*

Y. Chee, J. Rabaey, A. Niknejad, "Ultra Low Power Transmitters for Wireless Sensor Networks," Thesis, Electrical Engineering and Computer Sciences University of California at Berkeley, May 2006, url: https://www2.eecs.berkeley.edu/Pubs/TechRpts/2006/EECS-2006-57.pdf (Year: 2006).*

P. Khot, et al., "Design of Area efficient and Low Power Bandgap Voltage Reference using Sub-threshold MOS transistors", Int. Sym. VLSI Design, 2015.

W. Rahajandraibe, et al., "Very Low Power High Temperature Stability Bandgap Reference Voltage", ESSCIRC, 2002.

R. Magod, et al., "A 14.8 uVrms Integrated Noise Output Capacitor-less Low Dropout Regulator with a Switched-RC Bandgap Reference", Custom Integrated Circuits Conference, 2015.

China Office Action dated Apr. 17, 2020.

* cited by examiner

CIRCUIT AND METHOD FOR GENERATING A REFERENCE VOLTAGE WITH A VOLTAGE REGULATOR AND A SAMPLE AND HOLD CIRCUIT

TECHNICAL FIELD

The recited claims are directed, in general, to generating a reference voltage, and in particular to a bandgap circuit for generating a reference voltage.

BACKGROUND

Integrated circuits frequently include analog components that require a stable reference voltage for operation. These stable reference voltages are preferably generated such that a substantially constant reference voltage is provided as an output, regardless of any changes that occur in the integrated circuit, such as fluctuations in the input voltage, temperature fluctuations and changes in the loading conditions. Bandgap voltage reference circuits are a type of voltage regulator that can be used to generate stable output voltages under a variety of conditions. A bandgap reference circuit utilizes the inherent bandgap exhibited by semiconductor materials to regulate a supply voltage in providing a stable and accurate output reference voltage.

In a voltage regulator that generates a reference output voltage based on a supply voltage, the dropout voltage or headroom of the regulator is the minimum differential between the supply voltage and output voltage for which the regulator can maintain a stable output voltage. More headroom provides greater cushion to the voltage regulator in maintaining a stable output voltage. However, the greater the headroom that is implemented by a voltage regulator, the larger the required supply voltage, and thus the less suited a regulator is for low voltage applications. As such, low headroom (i.e., low dropout) regulators are preferred in low power applications that rely on efficient use of available battery power. For instance, in certain low power applications, such as battery-powered remote sensors used for data collection, devices may operate within power constraints that require a battery life of months or even years. In such applications, voltage regulators preferably operate using low voltages and using minimal headroom.

SUMMARY OF THE INVENTION

According to various circuit and method embodiments, a reference generator circuit is operable for generating a reference voltage based on a supply voltage is provided. The reference generator circuit is comprised of a voltage regulator operable to receive the supply voltage and drop the supply voltage to a regulated output voltage, wherein the voltage regulator is coupled to a sample-and-hold circuit and wherein the voltage regulator is disabled during at least a portion of the hold time of the sample-and-hold circuit. The sample-and-hold circuit operable to sample the regulated output voltage in response to the receipt of a refresh signal, and further operable to lock the reference voltage to the sampled regulated output voltage, and further operable to output the reference voltage during a hold time associated with the sample-and-hold circuit.

In various additional embodiments, the refresh signal is issued based on the hold time of the sample-and-hold circuit. In various additional embodiments, the voltage regulator is enabled prior to the issuance of the refresh signal. In various additional embodiments, the voltage regulator is comprised of a bandgap reference circuit operable to receive the supply voltage and generate a stable bandgap reference voltage; and an LDO (Low Drop Out) regulator circuit operable to drop the supply voltage to the regulated output voltage, where the regulated output voltage is determined by the LDO regulator circuit based on the bandgap reference voltage. In various additional embodiments, the LDO regulator is comprised of a pass element that drops the supply voltage to the regulated output voltage. In various additional embodiments, the pass element is a bipolar transistor. In various additional embodiments, the disabling of the voltage regulator comprises disabling the bandgap reference circuit. In various additional embodiments, the voltage regulator is disabled after waiting for the sample-and-hold circuit to sample and lock the reference voltage to the regulated output voltage. In various additional embodiments, the headroom of the voltage regulator is less than 0.1 V. In various additional embodiments, the supply voltage is less than 1.5 V.

BRIEF DESCRIPTION OF THE DRAWINGS

Figure 1:
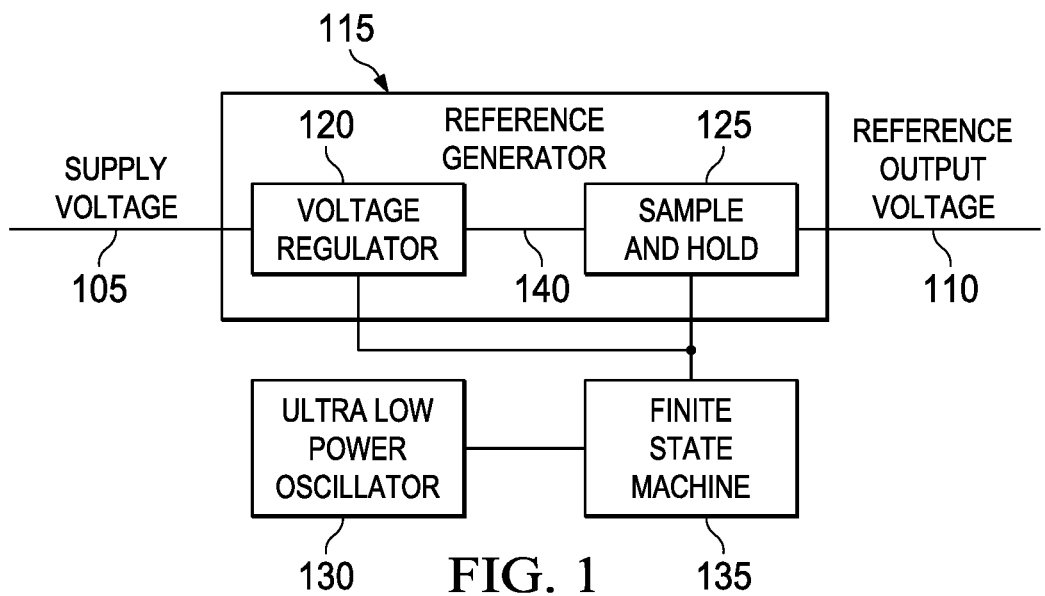

Having thus described the invention in general terms, reference will now be made to the accompanying drawings, wherein:

FIG. 1 is a block diagram illustrating certain components of a reference circuit according to various embodiments.

Figure 2:
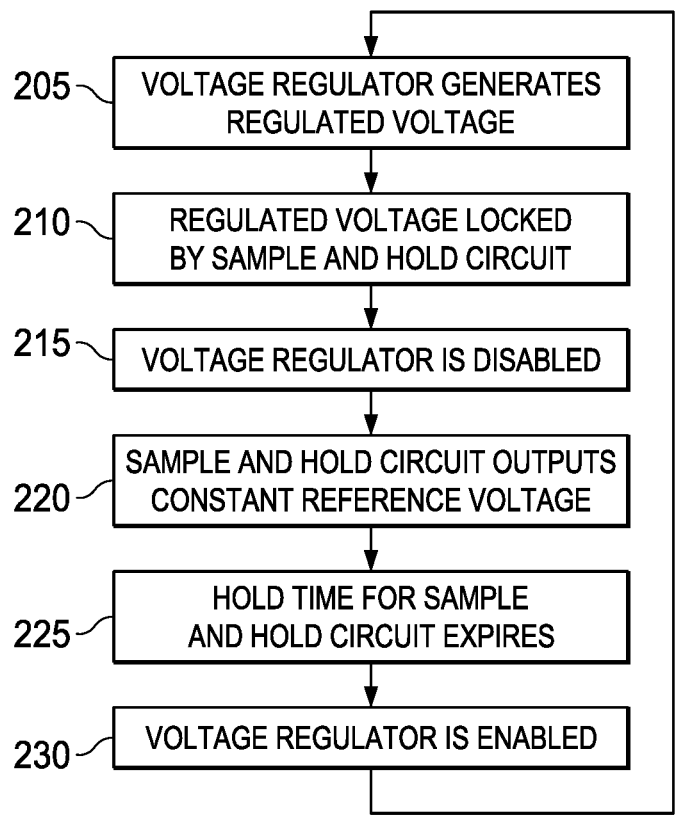

FIG. 2 is a process flow diagram illustrating certain steps of a process for generating a reference output voltage according to various embodiments.

Figure 3:
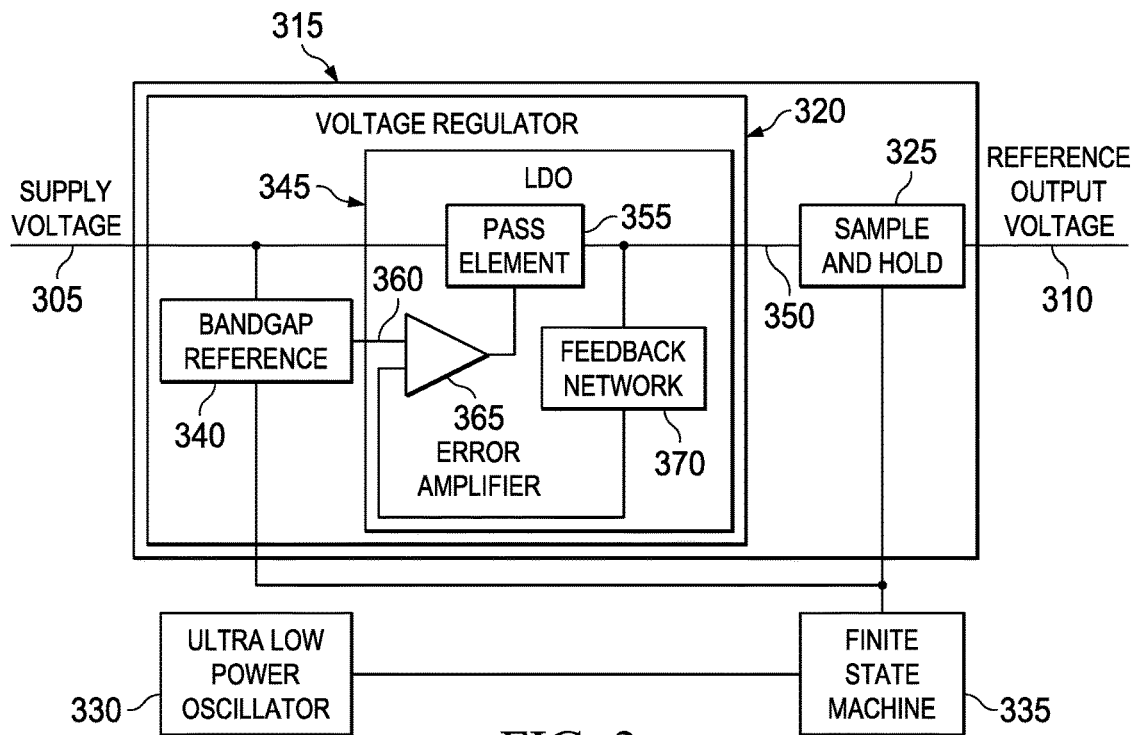

FIG. 3 is a block diagram illustrating certain components of a reference circuit according to various additional embodiments.

Figure 4:
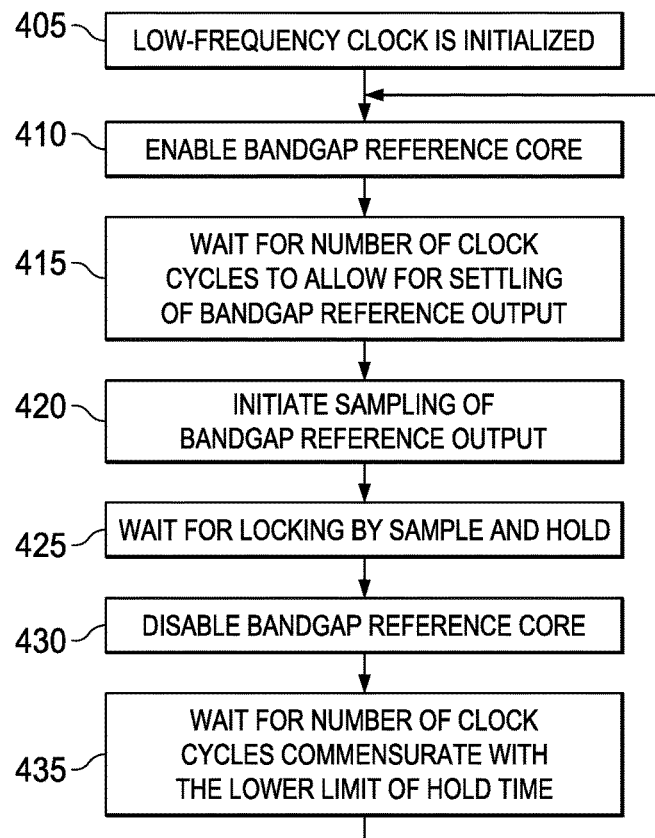

FIG. 4 s a process flow diagram illustrating certain steps of a process for duty cycling a reference voltage generator according to various embodiments.

DETAILED DESCRIPTION

The invention now will be described more fully hereinafter with reference to the accompanying drawings. This invention may, however, be embodied in many different forms and should not be construed as limited to the embodiments set forth herein. Rather, these embodiments are provided so that this disclosure will be thorough and complete, and will fully convey the scope of the invention to those skilled in the art. One skilled in the art may be able to use the various embodiments of the invention.

FIG. 1 is block diagram illustrating certain components of a reference generator circuit 115 according to various embodiments. In the illustrated reference generator circuit 115, a supply voltage 105 is provided as an input. In typical embodiments that support low-power processing applications, the supply voltage 105 may provide a 1.28 V input. The input voltage that is provided by the supply voltage 105 may be generally constant, but the supply voltage 105 may nonetheless exhibit variances due to a variety of factors, for instance due to changes in temperature or changes in the current drawn by the load the utilizes the reference generator circuit 115.

The reference generator circuit 115 utilizes the supply voltage 105 to generate a stable reference output voltage 110. In certain embodiments that utilize a 1.28 V supply voltage, the reference output voltage 110 may provide a stable 1.225 V output that can be used as a reference voltage in low-power applications. In such embodiments that utilize a 1.28 V supply voltage 105 and generate a 1.225 V reference output voltage 110, the reference generator circuit 115 operates at low power levels and does so while utilizing very low headroom, thus providing an efficient voltage reference generator that is especially suited for low-power applications. In addition, the reference generator circuit 115 provides a stable reference output voltage 110 that is constantly available, but also provides the efficiency benefits of a duty-cycled voltage reference generator without the attendant startup delays that normally result from utilizing a duty-cycled reference generator.

In order to generate a reference output voltage 110 in this manner, the reference generator circuit 115 utilizes a voltage regulator circuit 120 that is coupled to a sample and hold circuit 125. As described with respect to FIG. 3, in certain embodiments, the voltage regulator 120 may be a bandgap-referenced LDO (Low Drop Out) voltage regulator. The voltage regulator 120 may be configured to provide support for low supply and output voltages, while utilizing low headroom. In the illustrated embodiment, the voltage regulator 120 receives the supply voltage 105 and outputs a regulated voltage 140. In certain embodiments, the voltage regulator 120 is capable of receiving a 1.28 V supply voltage 105 and generating a 1.225 V regulated voltage 140, thus operating with 0.055 V of headroom.

A voltage regulator capable of providing a stable reference voltage within such operational parameters is especially suited to certain low-power applications such as remote, battery-powered sensor devices. In order to support deployment in diverse environments, such sensors may be required to tolerate certain levels of noise. Although a variety of techniques may be utilized for mitigating the effects of noise, low voltage devices are nonetheless susceptible to external noise (e.g., noise present in the supply voltage, environmental noise, and noise generated by the load). For instance, in a regulator with a 0.5 V output voltage, the signal-to-noise ratio becomes unacceptably low with just 50 mV of noise in the voltage signal. Consequently, a voltage regulator with a 0.5 V output may provide low headroom, but is not suitable for low voltage applications that require certain levels of noise tolerance. Embodiments provide a low-headroom voltage regulator capable of operating at low voltages that are suitable for use in noise tolerant applications.

Referring back to the operation of the voltage regulator circuit 120, the sample and hold circuit 125 locks onto the regulated voltage 140 generated by the voltage regulator 120 and provides an output reference voltage 110 that remains stable at the level of the locked regulated voltage 140 for a specific duration of time (i.e., the hold time of the sample and hold circuit). The hold time of the sample and hold circuit 125 is limited by the properties of the components used to construct the particular sample and hold circuit. Typical sample and hold circuits are constructed using one or more capacitors, switching elements and amplifiers that combine to sample an input signal, store the signal and discharge the stored signal at a constant rate for the hold time duration. The hold time for which the sample and hold circuit 125 can maintain a constant output reference voltage 110 will vary at least based on the characteristics of these amplifier, capacitor and switching components from which the sample and hold circuit 125 is constructed. The hold time of a sample and hold circuit 125 is also temperature dependent. In addition, leakages due to manufacturing variances and second-order effects will serve to limit the hold time of sample and hold circuit 125.

In the illustrated embodiment, the sample and hold circuit 125 is periodically refreshed based on command signals received from finite state machine 135. The finite state machine 135 may be configured according to various embodiments to periodically generate a refresh signal that may be dispatched based on the expiration of the hold time of the sample and hold circuit 125. In order to facilitate these timing capabilities of the finite state machine 135 and to maintain the efficient use of power in the generation of the output reference voltage 110, certain embodiments may utilize an ultra-low power oscillator 130. Using a clock signal generated by the ultra-low power oscillator 130, the finite state machine 135 can signal periodic refreshing of the sample and hold circuit 125, with the timing of the periodic signals based on a hold time associated with the sample and hold circuit 125. Upon receiving a refresh signal from the finite state machine 135, the sample and hold circuit 125 samples the output of the voltage regulator 120 and locks onto the regulated voltage 140.

In certain embodiments, the finite state machine 135 is further utilized to issue signals to the voltage regulator circuit 120, where these signals serve to disable the voltage regulator 120, or at least place the voltage regulator 120 in a low-power standby state, during intervals when the sample and hold circuit 125 is in a "hold" state. Thus, while the sample and hold circuit 125 continues to output a reference output voltage 110 that is stable and equal to the regulated voltage 140 that was locked by the sample and hold circuit 125, the voltage regulator 120 may be reconfigured in a power conserving state. Upon expiration of the hold time of the sample and hold circuit 125, or in certain embodiments in anticipation of the hold time expiration, the voltage regulator 120 may then be enabled in order to resume generation of the reference voltage 140 that can then be sampled by the refreshed sample and hold circuit 125. This coordination between the voltage regulator 120, the sample and hold circuit 125 and the finite state machine 135 is described in further detail with respect to the embodiments described in FIG. 4.

Operating in this manner, the reference generator circuit 115 provides a reference output voltage 110 that is continuously available (i.e., the reference generator is "always on"), while providing certain efficiencies of a duty-cycled voltage regulator. The sample and hold circuit 125 is periodically refreshed such that the reference output voltage 110 is maintained at the regulated voltage 140 provided by the voltage regulator 120. Since the regulated voltage 140 that is output by the voltage regulator 120 is only required during sampling periods by the sample and hold circuit 125, the voltage regulator 120 can be placed in a low power mode during holding periods by the sample and hold circuit 125. Configured in this manner, the reference generator 115 is effectively duty cycled in a manner that conserves available battery power, while still providing a constant reference output that is always available. The power savings that are provided by this duty-cycling of the reference generator circuit 115 depend in part on the hold time of the sample and hold circuit 125. The longer the hold time of the sample and hold circuit 125, the longer the voltage regulator 120 may remain in a low-power standby state and the more power that is conserved.

FIG. 2 depicts certain steps of a process according to various embodiments for generating a reference output voltage using a reference generator 115, where the reference generator 115 includes a voltage regulator 120 and a sample and hold circuit 125 such as described with respect to the embodiment of FIG. 1. In the embodiment illustrated in FIG. 2, the process begins at step 205 with the voltage regulator dropping the supply voltage down to a stable, regulated voltage. In certain embodiments, the voltage regulator may be a bandgap-referenced LDO (Low Drop Out) voltage regulator that is capable of operating using low supply voltages while also capable of supporting low levels of headroom.

At step 210, the regulated output generated by the voltage regulator is sampled and locked by the sample and hold circuit. In certain embodiments, the sample and hold circuit samples the regulated output in response to a refresh signal issued by an external logic component, such as the finite state machine 135 of FIG. 1. With the sample and hold circuit locked onto the regulated output voltage, at step 215, the voltage regulator is disabled, or at least place in a standby mode that consumes minimal power. In certain embodiments, the voltage regulator is disabled based on a signal issued by a logic component, such as the finite state machine 135 of FIG. 1.

During step 220, the sample and hold circuit is in a "hold" state and is generating a constant output voltage that is equal to the regulated output voltage that was locked by the sample and hold circuit. During this hold period, the voltage regulator remains disabled and the reference generator thus operates in a power conservation mode. At step 225, the hold time for the sample and hold circuit expires, such that the sample and hold circuit can no longer maintain a constant output voltage. In response to the expiration of the hold time of the sample and hold circuit, at step 230, the voltage regulator is enabled. In certain embodiments and as discussed with respect to FIGS. 3 and 4, the voltage regulator may be enabled in anticipation of the expiration of the hold time in order to account for the time required to restart the voltage regulator and for the voltage regulator output to settle in the generation of a stable regulated voltage. Once the voltage regulator is enabled, the process returns to step 205, where the regulated voltage is generated and again becomes available for sampling and locking by the sample and hold circuit.

FIG. 3 is block diagram illustrating certain components of a reference generator circuit 315 according to various additional embodiments. Similar to the embodiment of FIG. 1, the reference circuit 315 utilizes a voltage regulator 320 that generates a regulated voltage 350 based on a supply voltage 305. As before, a sample and hold circuit 325 samples and locks the regulated voltage 350 and, during the hold time, the sample and hold circuit 325 outputs a constant reference output voltage 310. Also as described with respect to the embodiment of FIG. 1, the sample and hold circuit 325 is periodically refreshed based on signals issued by a logic component, such as finite state machine 335 which utilizes a ultra-low power oscillator 330 in determining the timing of the periodic refresh signals that are generated by the finite state machine 335.

In the embodiment of FIG. 3, the voltage regulator 320 includes an LDO regulator 345 and bandgap reference core 340. Based on the supply voltage 305 received by the voltage regulator 320, the bandgap reference core 340 generates a bandgap reference 360 that is utilized as a reference signal by the LDO regulator 345. The bandgap reference core 340 provides a stable reference signal (the bandgap reference 360), which the LDO regulator 345 is configured to reproduce as the reference output voltage 310. The LDO regulator 345 is also configured to maintain the reference output voltage 310 at the voltage level provided by the bandgap reference 360 in response to any changes in the load that draws from the reference generator circuit 315. In certain embodiments, the bandgap reference core 340 is a Brokaw PNP-based bandgap circuit. In the illustrated embodiment, the purpose of the bandgap reference core 340 is to generate the bandgap reference 360. However, in other embodiments, the bandgap reference 360 generated by the bandgap reference core 340 may be further provided for use as a reference and/or as biasing current by other components.

In certain applications, bandgap reference circuits are used to generate a reference voltage that can be used as a stable reference similar to the reference output voltage 310 generated by the reference generator circuit 315. Although a bandgap circuit can be used to provide a stable reference voltage, bandgap circuits do not typically operate with sufficiently low headroom for low-power applications, especially for ultra-low power applications such as the described remote sensor applications. Accordingly, the bandgap reference core 340 is utilized according to various embodiments to provide a reference voltage to an LDO, which can operate within the headroom constraints of low power applications.

The LDO regulator 345 is a type of voltage regulator that is specially configured such that the minimum voltage required between the input and the output (i.e., the drop out voltage or headroom) is particularly low. In certain embodiments, the LDO regulator 345 is a dual-loop regulator that enables the simultaneous regulation of the output voltage 350 while also rejecting noise in the supply voltage 305. At lower operating voltages, noise in the supplied input voltage becomes increasing problematic as the signal-to-noise ratio drops. The PSR (Power Supply Rejection) of a component indicates the ability of the component to reject noise in the supply voltage. Using the dual loop architecture, a lower supply voltage 305 can be utilized, while still providing adequate PSR.

In the illustrated embodiment, the LDO regulator 345 includes a pass element 355, an error amplifier 365 and a feedback network 370. The pass element 355 is a component that drops the supply voltage 305 down to the regulated voltage 350 that is the output of the LDO regulator 345. The pass element of an LDO may be one or more transistor elements that operate in their linear/saturation region to generate the regulated output voltage of the LDO. These transistor pass elements of an LDO can be either bipolar transistors or MOSFETs.

The regulated voltage 350 that is output by the pass element 355 is processed by feedback network 370 and provided as an input to the error amplifier 365. In response, the error amplifier 365 compares this feedback to the bandgap reference 360 in order to generate a signal that controls the pass element. By controlling the pass element 355 in the manner, the regulated voltage 350 that is generated by the pass element 355 is matched to the voltage of the bandgap reference 360. More specifically, if the regulated voltage 350 rises too high or too low relative to the voltage of the bandgap reference 360, the feedback network 370 and error amplifier 365 generate a signal that drives the pass element 355 such that it maintains the regulated voltage 350 at the same level as the voltage bandgap reference 360. In embodiments where the pass element 355 is a bipolar transistor, the output of the error amplifier 365 drives the base of the bipolar transistor in order to regulate the voltage level of the regulated voltage 350 that is output by the bipolar transistor. The LDO regulator 345 may include various additional components. For instance, in certain embodiments, the LDO may include one or more capacitors that may be used to promote stabile operation by the LDO.

As with the embodiment of FIG. 1, the regulated voltage 350 that is output by the LDO regulator 345 is periodically sampled and locked by the sample and hold circuit 325. In the embodiment of FIG. 1, the voltage regulator 120 is disabled during the hold time of the sample and hold circuit 125 in order to conserve power. In the embodiment of FIG. 3, the bandgap reference core 340 of the voltage regulator 320 is disabled during the hold time of the sample and hold circuit 325. In general, a bandgap reference circuit generates a temperature-independent reference voltage through the determination of a voltage difference between two transistors with different temperature response characteristics. This process for generating a reference voltage results in a bandgap reference circuit having a relatively high current draw. Accordingly, in the embodiment of FIG. 3, the finite state machine 335 is further configured to signal the disabling and enabling of the bandgap reference core 340 such that the bandgap reference core 340 is disabled during at least a portion of the hold time of the sample and hold circuit 325. Upon being disabled, the bandgap reference core 340 may enter a standby mode, during which no bandgap reference 360 is generated and power consumption by the bandgap reference core 340 is minimized.

FIG. 4 depicts certain steps of a process according to various embodiments for duty cycling a voltage regulator 320 as described with respect to the embodiment of FIG. 3. More specifically, FIG. 4 depicts certain steps of a process for coordinating the disabling and enabling of the bandgap reference core 360 in coordination with the sampling, locking and holding phases of the operation of the sample and hold circuit 325. Through these steps of the embodiment of FIG. 4, the voltage regulator 320 is duty cycled such that the power consumption of the bandgap reference core 360, and by consequence the LDO regulator, is reduced during periods where the sample and hold circuit 325 is holding a stable reference output voltage 310. The process of FIG. 4 begins with the initialization of the low frequency, ultra-low power oscillator 330 that provides a clock signal to a logic component, such as finite state machine 335.

At step 410, the finite state machine is configured to enable the bandgap reference core. In certain embodiments, the finite state machine generates a signal that enables the bandgap reference core. Upon being enabled, the bandgap reference core begins generating the bandgap reference voltage that is based on the supply voltage. Utilizing the provided clock signal, at step 415, the finite state machine waits for the bandgap reference voltage to settle to a stable value that is suitable for sampling. The length of time required for settling by bandgap reference circuit will vary based on the characteristics of the circuit. In many instances, bandgap reference circuits are designed with relatively slow slew rates in order to counteract certain of the undesirable effects of rapid changes in the supply voltage (e.g., inrush current resulting from enabling and/or disabling the bandgap reference circuit). As a consequence, certain bandgap reference circuits may exhibit slow settling times that must be accounted for in the duty cycle process of FIG. 4. Thus, the number of clock cycles that are waited at step 415 by the finite state machine may be configured to allow sufficient setting time for the bandgap reference circuit.

At step 420, the finite state machine signals for the sample and hold circuit to sample the settled bandgap reference voltage, thus initiating refreshing of the sample and hold circuit. At step 425, the finite state machine waits a sufficient number of clock cycles to allow the sample and hold circuit to lock on to the bandgap reference voltage that is output by the LDO voltage regulator. As with the settling time of the bandgap reference circuit, the length of time required for locking by a sample and hold circuit may vary according to the particular implementation of the sample and hold circuit. The locking time required by a sample and hold circuit is used to configure the length of the wait time by the finite state machine at step 425.

Once sufficient time has elapsed to allow the sample and hold circuit to lock onto the bandgap reference voltage and enter hold mode, at step 430, the bandgap reference circuit is disabled. At this point, the bandgap reference circuit enters a standby mode that consumes minimal power. The bandgap reference circuit may remain in standby mode as long as the sample and hold circuit can remain in hold mode. As described, the hold time associated with a particular sample and hold circuit may be used to configure the wait time by the finite state machine.

At step 435, the finite state machine waits while the sample and hold circuit remains in hold mode. In order to account for variances in the actual hold time by the sample and hold circuit, certain embodiments will configure this wait period to be a period of time that is commensurate to a lower limit value for the hold time of the sample and hold circuit. This lower limit value may be a configurable percentage of the hold time that can be used as the duration of the wait period at step 435. This percentage can then be configured such that the bandgap reference core remains in a power conserving state for as much of the hold time as possible, while still enabling the bandgap reference circuit in sufficient time to generate a settled bandgap reference voltage before the expiration of the hold time. In this manner, various aspects of the duty cycle for the voltage regulator may be synchronized in order to reduce power consumption and conserve available battery power.

The hold time of the sample and hold circuit may also vary according to temperatures in the voltage regulator integrated circuit. As such, the duration of the wait period of the finite state machine at step 435 may be further configured based on temperature information. For instance, at higher temperatures, a sample and hold circuit may be expected to experience higher current leakage, thus reducing the hold time. Accordingly, the finite state machine may be configured to adjust the wait time at step 435 based on temperature information that indicates an effect on the hold time of the sample and hold circuit.

In certain embodiments, the duty cycle enforced upon the voltage regulator may be selected based on another duty cycle in the same device or based on a duty cycle associated with the device itself. For instance, in low power remote sensor applications, the transmit capabilities of the remote sensor may only be periodically enabled. During periods where transmission capabilities are disabled, data collection by the sensor may continue, but power will nonetheless be preserved by disabling of the transmission capabilities. Thus, by intermittently disabling transmission capabilities, less power is consumed by the remote sensor and battery life is accordingly prolonged. In such remote sensor embodiments, the duty cycle enforced on the voltage regulator may be selected in order to coincide as regularly as possible with the transmission duty cycle of the remote sensor. Other embodiments may seek to synchronize the duty cycle of the voltage regulator with various other duty cycles employed by the remote sensor.

Many modifications and other embodiments of the invention will come to mind to one skilled in the art to which this invention pertains having the benefit of the teachings presented in the foregoing descriptions, and the associated drawings. Therefore, it is to be understood that the invention is not to be limited to the specific embodiments disclosed.

Although specific terms are employed herein, they are used in a generic and descriptive sense only and not for purposes of limitation.

What is claimed is:

1. A reference generator circuit for generating a reference voltage, the reference generator circuit comprising:
   a voltage regulator configured to:
      receive a supply voltage; and
      drop the supply voltage to a regulated output voltage;
   a sample-and-hold circuit coupled to the voltage regulator, the sample-and-hold circuit configured to:
      sample the regulated output voltage in response to receiving a refresh signal, to produce a sampled regulated output voltage;
      lock the reference voltage to the sampled regulated output voltage; and
      output the reference voltage during a hold time of the sample-and-hold circuit; and
   a finite state machine coupled to the voltage regulator and to the sample-and-hold circuit, the finite state machine configured to generate a control signal enabling or disabling the voltage regulator, wherein the finite state machine is configured to generate the control signal such that a duty cycle of the voltage regulator coincides with a transmission duty cycle of a sensor circuit coupled to the reference generator circuit such that:
      the voltage regulator is enabled based on a transmit capability of the sensor circuit being enabled; and
      the voltage regulator is disabled, while a collection capability of the sensor circuit is enabled, based on the transmit capability of the sensor circuit being disabled.

2. The reference generator circuit of claim 1, wherein the finite state machine is configured to generate the refresh signal based on the hold time of the sample-and-hold circuit.

3. The reference generator circuit of claim 2, wherein the finite state machine is configured to generate the control signal to enable the voltage regulator prior to receiving the refresh signal.

4. The reference generator circuit of claim 1, wherein the voltage regulator includes:
   a bandgap reference circuit operable to receive the supply voltage and generate a bandgap reference voltage; and
   an LDO (Low Drop Out) regulator circuit operable to drop the supply voltage to the regulated output voltage, where the regulated output voltage is determined by the LDO regulator circuit based on the bandgap reference voltage.

5. The reference generator circuit of claim 4, wherein the LDO regulator circuit includes a pass element that drops the supply voltage to the regulated output voltage.

6. The reference generator circuit of claim 5, wherein the pass element is a bipolar transistor.

7. The reference generator circuit of claim 4, wherein the finite state machine is configured to generate the control signal to disable the bandgap reference circuit during the at least a portion of the hold time of the sample-and-hold circuit.

8. The reference generator circuit of claim 1, wherein the finite state machine is configured to generate the control signal to disable the voltage regulator after waiting for the sample-and-hold circuit to sample and lock the reference voltage to the sampled regulated output voltage.

9. The reference generator circuit of claim 1, wherein headroom of the voltage regulator is less than 0.1 V.

10. A method for generating a reference voltage, the method comprising:
    receiving, by a voltage regulator, a supply voltage;
    dropping, by the voltage regulator, the supply voltage to a regulated output voltage;
    generating, by a finite state machine, a refresh signal;
    sampling, by a sample-and-hold circuit, the regulated output voltage, in response to receiving the refresh signal, to lock an output of the sample-and-hold circuit to the regulated output voltage;
    disabling the voltage regulator during at least a portion of a hold time of the sample-and-hold circuit;
    outputting, by the sample-and-hold circuit, during the hold time of the sample-and-hold circuit, the reference voltage; and
    generating, by the finite state machine, a control signal enabling or disabling the voltage regulator while a collection capability of a sensor circuit is enabled, the control signal to enable or disable the voltage regulator based on a transmit duty cycle of the sensor circuit such that the voltage regulator is disabled when a transmit capability of the sensor circuit is disabled.

11. The method of claim 10, wherein the generating of the refresh signal is based on the hold time of the sample-and-hold circuit.

12. The method of claim 11, further including enabling the voltage regulator before receiving the refresh signal.

13. The method of claim 10, wherein the voltage regulator includes a bandgap reference circuit and an LDO (Low Drop Out) regulator circuit, wherein receiving the supply voltage includes receiving, by the bandgap reference circuit, the supply voltage, and the method further including:
    generating, by the bandgap reference circuit, a bandgap reference voltage as an output; and
    dropping, by the LDO regulator circuit, the supply voltage to the regulated output voltage, the regulated output voltage determined by the LDO regulator circuit based on the bandgap reference voltage.

14. The method of claim 13, wherein dropping the supply voltage to the regulated output voltage is performed using a pass element.

15. The method of claim 14, wherein the pass element is a bipolar transistor.

16. The method of claim 13, wherein the disabling of the voltage regulator includes disabling the bandgap reference circuit.

17. The method of claim 10, wherein the disabling of the voltage regulator is performed after waiting for the sample-and-hold circuit to sample and lock the reference voltage to the regulated output voltage.

18. An integrated circuit comprising:
    a sensor circuit;
    a finite state machine to generate a first control signal and a second control signal;
    a voltage regulator coupled to the finite state machine, wherein the voltage regulator is to:
       transition, while a collection capability of the sensor circuit is enabled, between enabled and disabled based on the first control signal, wherein the finite state machine is configured to generate the first control signal such that a duty cycle of the voltage regulator corresponds to a transmit duty cycle of the sensor circuit such that the voltage regulator is disabled when a transmission capability of the sensor circuit is disabled;
       receive a supply voltage; and
       when enabled, provide a regulated voltage based on the supply voltage;

a sample-and-hold circuit coupled to the voltage regulator and the finite state machine, wherein the sample-and-hold circuit is to:
  in response to the second control signal indicating a sampling period, sample the regulated voltage to produce a sampled regulated voltage; and
  in response to the second control signal indicating a holding period, output a reference voltage based on the sampled regulated voltage.

19. The integrated circuit of claim 18, wherein the finite state machine is configured to adjust a timing of the first control signal and a timing of the second control signal based on a temperature of the integrated circuit.

20. The integrated circuit of claim 18, wherein the sensor circuit is configured to collect data when the transmission capability of the sensor circuit is disabled.

\* \* \* \* \*